(12) United States Patent
Cosley et al.

(10) Patent No.: US 6,598,668 B1
(45) Date of Patent: Jul. 29, 2003

(54) EXHAUST SYSTEM FOR ELECTRONIC EQUIPMENT ENCLOSURE

(75) Inventors: Michael R. Cosley, Crystal Lake, IL (US); Julius C. Lockhart, Chicago, IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/548,043

(22) Filed: Apr. 12, 2000

(51) Int. Cl.[7] .............................................. F28D 15/00
(52) U.S. Cl. ............. 165/104.32; 165/135; 165/104.34; 454/354; 454/367; 454/368; 312/236
(58) Field of Search ................. 165/104.33, 104.32, 165/104.34, 134.1, 135, 104.21, 104.06; 312/236; 454/368, 367, 354, 94, 184–186

(56) References Cited

U.S. PATENT DOCUMENTS

| 1,087,296 A | * | 2/1914 | Johnson ...................... 454/368 |
| 1,542,740 A | * | 6/1925 | Spillman ..................... 454/367 |
| 3,601,496 A | * | 8/1971 | Kemp ......................... 454/368 |
| 3,654,850 A | * | 4/1972 | Berkus ........................ 454/367 |
| 4,080,083 A | * | 3/1978 | Malott ........................ 454/368 |
| 4,090,436 A | * | 5/1978 | Wright ........................ 454/368 |
| 5,001,602 A | | 3/1991 | Suffi et al. |
| 5,136,463 A | | 8/1992 | Webster |
| 5,570,740 A | * | 11/1996 | Flores et al. ........... 165/104.34 |
| 5,832,988 A | * | 11/1998 | Mistry et al. .......... 165/104.34 |
| 6,088,225 A | * | 7/2000 | Parry et al. ............. 165/104.33 |
| 6,119,768 A | * | 9/2000 | Dreier et al. ........... 165/104.33 |

* cited by examiner

Primary Examiner—Christopher Atkinson
(74) Attorney, Agent, or Firm—Jones Day

(57) ABSTRACT

A top cover for an electronic equipment cabinets where the top cover is made of upper and lower synthetic resin panels which are welded at their edges to form an air chamber therebetween. The upper panel is domed while the lower panel has a corrugated like structure. Access ports are provided which may be sealed shut. Rain directing berms are also provided to direct rain to the corners of the cover and away from access doors to a sealed electronic equipment chamber in the cabinet. A lateral air and water exhaust duct extending the width of the cover is provided as a path for exhaust air from a heat exchanger which normally moves in one direction but under high wind conditions may move in the opposite direction and for allowing the passage of rain water from one side of the cabinet to the opposite side.

2 Claims, 3 Drawing Sheets

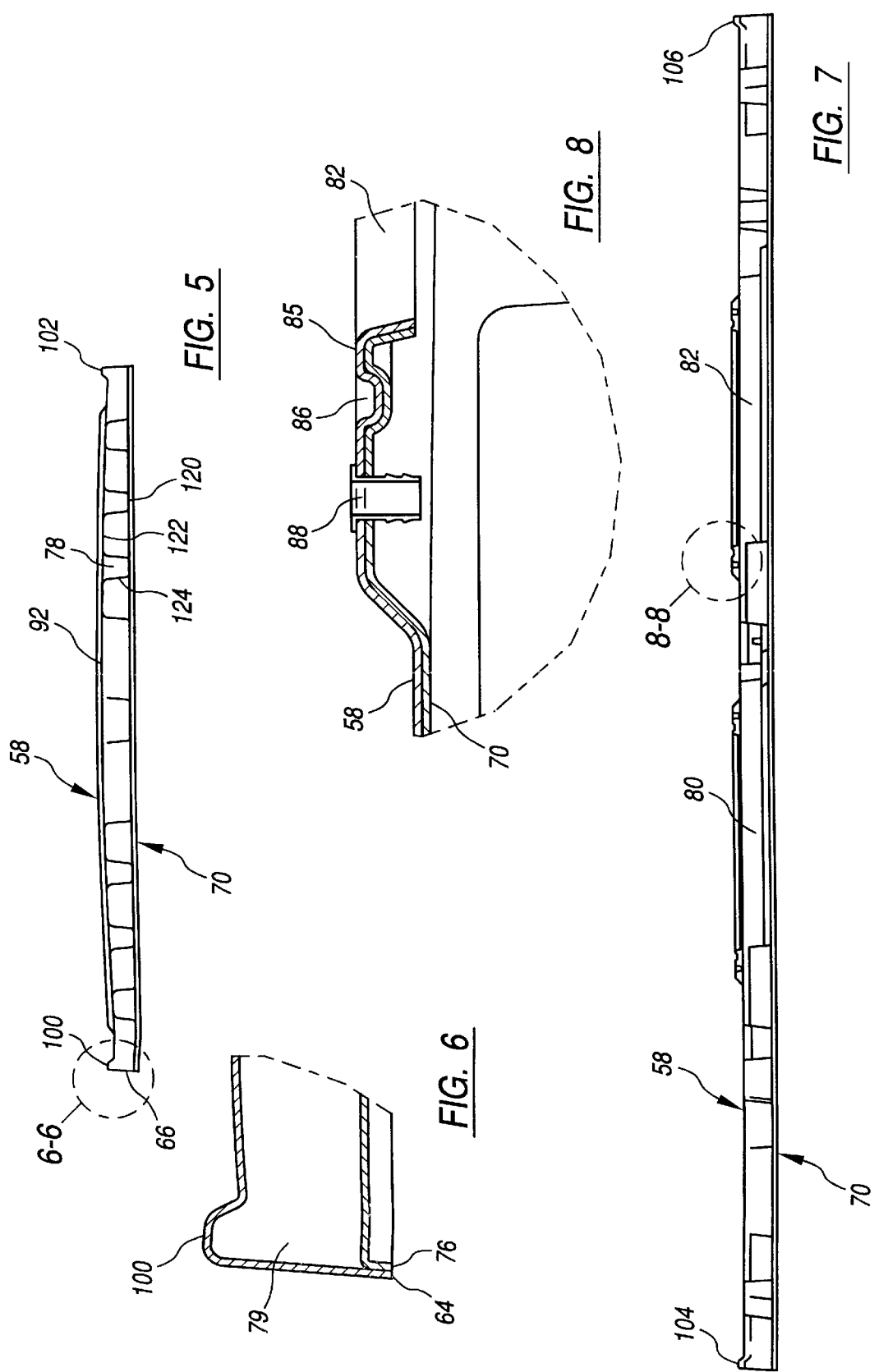

EXHAUST SYSTEM FOR ELECTRONIC EQUIPMENT ENCLOSURE

BACKGROUND OF THE INVENTION

1. Field of the Invention

The present invention relates to an exhaust system for electrical equipment enclosures and, more particularly, to a top cover for electronic equipment enclosures which provide better thermal insulation and noise abatement as well as other benefits.

2. Description of the Related Art

Some types of electronic or related equipment are typically located out of doors. Examples are telecommunications equipment and cable television or data equipment. Often this class of equipment is referred to as "outside plant equipment" and/or "remote terminals." Also, it is well know that this equipment generates excessive heat and undesirable gas. Further, this outside plant equipment may be located just about any place on the planet, in very warm, cold, wet, dry, and high wind climates and at high and low altitudes.

Over the last several years specialized enclosures or cabinets have been engineered to form a protective environment for the outside plant equipment. Presently, such electronic equipment enclosures or cabinets are constructed with all metal outer panels, a weather sealed chamber for some of the equipment and non-sealed chambers for other portions of the equipment. The metal panels, however, have relatively poor thermal insulation qualities and noise abatement characteristics. When steps are taken to alleviate these problems, costs of manufacture and assembly increase prohibitively. Even without these steps, steel or aluminum panels are expensive and unnecessarily heavy.

The general design of the metal cabinets, and especially heat exchange units located within the cabinets for cooling the heat generated by the equipment, may be appreciated by reference to U.S. Pat. Nos. 5,832,988 and 5,570,740. The climatic and human problems faced by the industry and vendor requirements generated to protect this outside plant equipment are explained in those patents. Important steps have been take to alleviate some problems but problems remain nevertheless.

BRIEF SUMMARY OF THE INVENTION

The present invention improves upon the metal covers now being used for equipment cabinets and a number of advantages are achieved by the improvement. What is described here is an equipment enclosure comprising front, rear and side portions and an interior chamber, a heat exchanger mounted within the interior chamber, a centrifugal fan mounted to the heat exchanger for drawing ambient air, the fan being separated from the interior chamber, a top cover forming a fan casing for the centrifugal fan mounted to the front and rear portions, the top cover including oppositely disposed passageways extending from the fan casing to a periphery of the top cover, and an air chamber in the top cover.

An object of the present invention is to provide a cover for electronic equipment enclosures which has good thermal insulation qualities, good acoustical suppression qualities and sufficient strength for effective use. Another aim of the present invention is to provide a cover for electronic equipment enclosures which is relatively easy and inexpensive to manufacture and which is easy to assemble with the remainder of an enclosure. Still another advantage of the present invention is to provide a cover for electronic equipment enclosures which is relatively light in weight. Further aspects of the present invention are to provide a cover which controls rain water runoff and which handles high wind conditions through the use of a dual exit for heat exchanger exhaust. Yet still other objects of the present invention are to provide a more powerful heat exchanger and an exhaust system that prevents blockage of the exhaust air from the heat exchanger.

A more complete understanding of the present invention and other objects, aspects, aims and advantages thereof will be gained from a consideration of the following description of the preferred embodiment read in conjunction with the accompanying drawings provided herein.

BRIEF DESCRIPTION OF THE SEVERAL VIEWS OF THE DRAWINGS

FIG. 5 is a sectional, side elevational view of the cover taken along line 5—5 of FIG. 3.

FIG. 6 is an enlarged fragmentary view of a portion of FIG. 5 taken within the circle 6—6 of FIG. 5.

FIG. 7 is a sectional, front elevational view of the cover taken along line 7—7 of FIG. 3.

FIG. 8 is an enlarged fragmentary view of a portion of FIG. 7 taken within the circle 8—8 of FIG. 7.

DETAILED DESCRIPTION OF THE INVENTION

Figure 1:
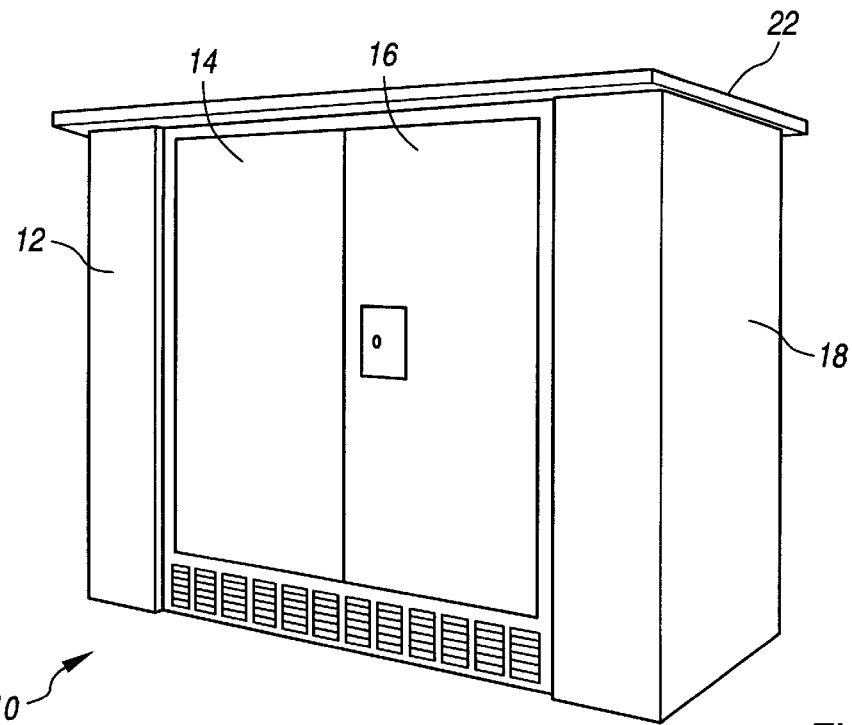
FIG. 1 is a front perspective view of an electronic equipment enclosure.

While the present invention is open to various modifications and alternative constructions, the preferred embodiment shown in the drawings will be described herein in detail. It is understood, however, that there is no intention to limit the invention to the particular form disclosed. On the contrary, the intention is to cover all modifications, equivalent structures and methods, and alternative constructions falling within the spirit and scope of the invention as expressed in the appended claims.

Figure 2:
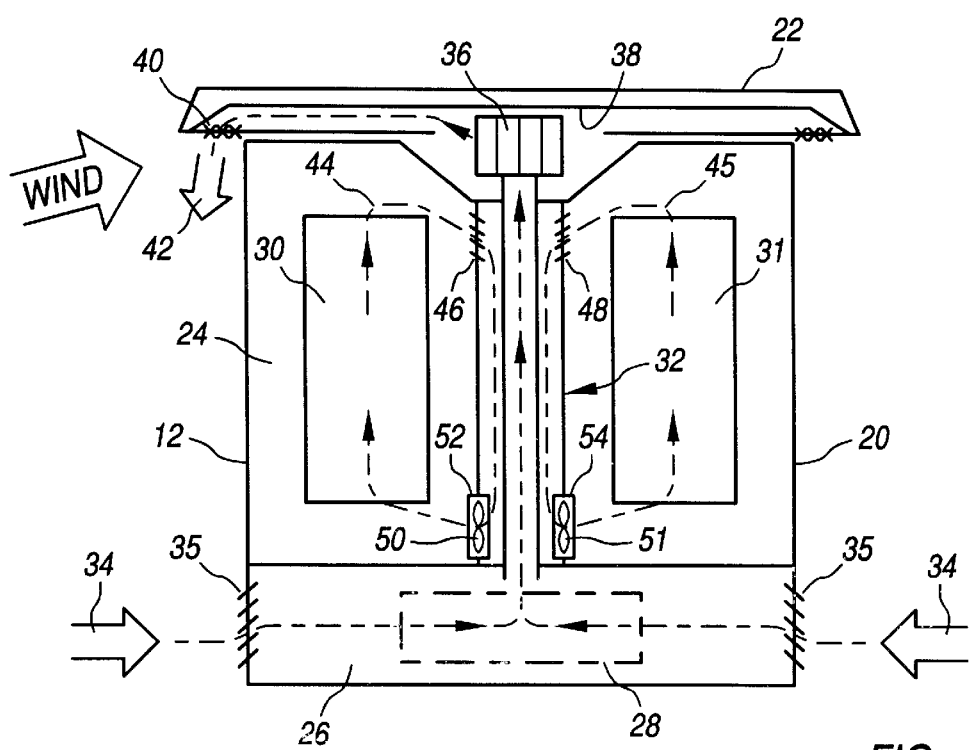
FIG. 2 is a diagrammatic side elevational view of the enclosure of FIG. 1.

An electronic equipment enclosure or cabinet typically is a free standing boxlike structure located out-of-doors where it is bolted to a concrete slab and where it is exposed to the sun, rain, wind and other environmental and climatic elements. These enclosures or cabinets are designed to house a variety of electronic equipment, for example, digital loop carriers, fiber optic transport systems, radio equipment for wireless applications, and remote power systems as well as telephone equipment. Because the enclosure is situated out-of-doors, there is a need to be concerned about such matters as high temperatures and direct exposure to the sun on the one hand and hurricane weather on the other as well as impacts from such items as bullets and pellets. Referring now to FIGS. 1 and 2, there is illustrated such an enclosure 10 having a front wall 12 with two access doors 14 and 16, a pair of sidewalls, such as the wall 18, and a rear wall 20 also having two access doors (not shown). In addition, the enclosure includes a top cover 22. The enclosure includes a sealed upper chamber 24 for the electronic equipment and a back-up battery lower chamber 26 which is open to ambient air. The back-up battery 28 is useful should there be an electrical outage. The electronic equipment, fiber optics, radio equipment or the like 30, 31 is located in the sealed upper chamber 24 attached to racks that also provide a frame for the enclosure. The enclosure is also provided with a heat exchanger 32 because the electronic equipment generates heat. Heat build up may also be caused by solar impingement. As shown in FIG. 2, the heat exchanger draws in outside air represented by the arrows 34 through louvers 35 into the bottom chamber 26 and into the heat exchanger 32. This intake of outside air is accomplished by a powerful centrifugal fan 36 at the top of the heat exchanger. The air is then passed through an exhaust duct 38 and exhausted to the ambient air through a screen 40 as depicted by the arrow 42. This movement of air, in addition to supplying cool air to the heat exchanger, also ventilates the lower chamber 26 to prevent any undesirable gas or heat build-up from the batteries 28.

The heat exchanger 32 is known as a dual air, vertical flow device. Heated air from the sealed upper chamber 24 represented by the phantom curves 44, 45 travels in a circular pattern where it is cooled in the heat exchanger. This heated air from the equipment in the sealed upper chamber is sucked through openings 46, 48 in the upper portion of the heat exchanger and then is drawn downwardly by fans 50, 51 at the bottom of the heat exchanger. In the process, heat is transferred from the hot, downwardly moving equipment air to the cool upwardly moving ambient air. The cooled equipment air is exhausted through vents 52, 54 near the bottom of the heat exchanger 32. As can be appreciated, the equipment air from the sealed chamber 24 never mixes with the cooling ambient air.

Each part of the enclosure 10 should be specifically designed to create an efficient and effective cabinet structure. The present invention involves an improved top cover 22 that provides for a more effective and efficient cabinet. The cover 22 has an upper panel 58, FIG. 3 of synthetic resin material with a length represented by the line 60, a width represented by the line 62, an edge portion 64 and a periphery 66. The top cover also includes a lower panel 70, FIG. 4, made of a similar synthetic resin material and having generally the same or very similar length 72, width 74, edge portion 76, FIG. 6, and periphery 78 as the upper panel 58. The upper panel includes an additional layer or "cap stock" to provide UV protection. Typically, the bottom panel does not need such a layer.

The upper panel and the lower panel are sealed together by ultrasonic welding at their edge portions 64, 76, FIG. 6. By doing this, an air chamber 79 is formed which helps the top cover to act as a thermal insulator to solar impingement. Two access ports 80, 82 are provided in the top cover (FIGS. 3 and 4) to allow access to the heat exchanger fans, such as the fan 36, FIG. 2. These access ports are covered with lids, such as a lid 84, FIG. 3. If there is a need to service or replace the heat exchanger fans, this can be easily accomplished by removing the lids to expose the fans.

Referring to FIG. 8, a rim 85 around the access port 82 is shown in more detail. The rim includes a groove 86 located just outwardly of the port. The groove is present seat an O-ring seal for weatherproofing the port. Beyond the groove 86 in a radial direction is a fastener sleeve 88 for receiving a fastener, such as a screw (not shown), that goes through a fastener opening 90, FIG. 3 of the lid 84. The weather sealing of the port becomes effective when the lid 84 is tightened downwardly by fasteners on the seal located in the groove 86.

To maintain weather tightness of the sealed chamber 24, another seal or gasket (not shown) is provided between the upper edges of the front and side walls and the lower panel 70. All doors also have peripheral seals. The material of the seals may be ethylene propylene diene methylene or "EPDM" and is well known by those skilled in the sealing art. The material of the upper and lower panels may be of a PVC blend sold under the Royalite R 87/59 brand by Spartech of South Bend, Ind.

Figure 3:
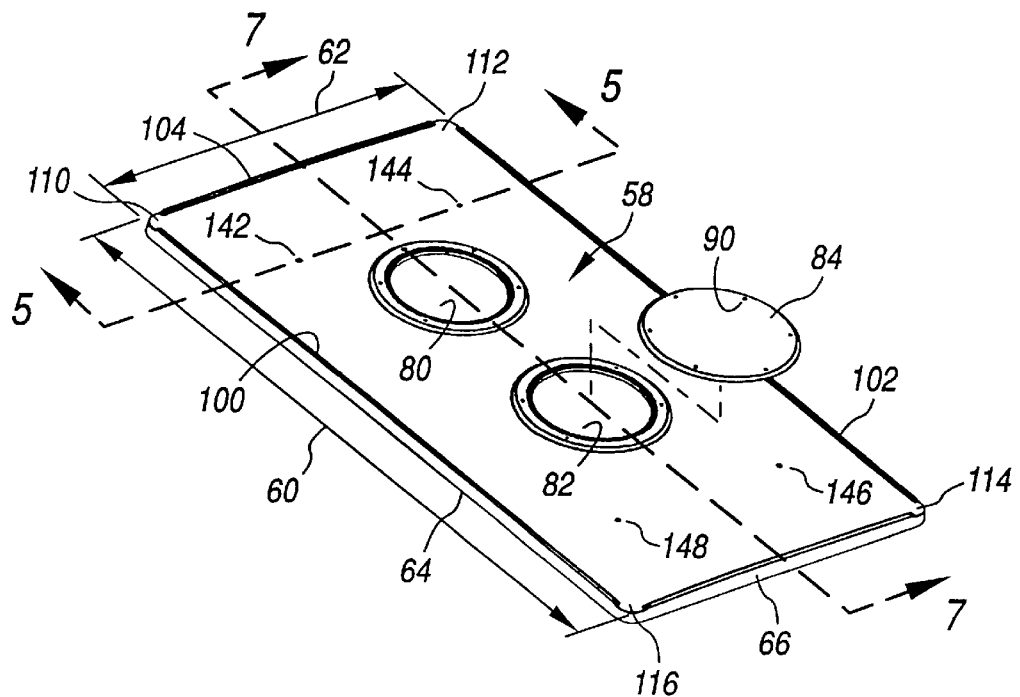
FIG. 3 is a top isometric view of an enclosure cover.

Referring now to FIG. 5, the upper panel 58 has an upper surface 92 which has a slightly bowed shape across its width. The upper panel may also have a slightly bowed shape across its length. The bowed shape ensures that rainwater will run off the cover toward the periphery 66. To prevent rainwater from coming down in front of the access doors 14, 16 of the front wall 12 or the doors of the rear wall 20, length-wise extending berms 100, 102, FIGS. 3, 5 and 6 are provided at the periphery which extend almost the entire length of the cover as shown in FIG. 3. As readily seen in FIGS. 5 and 6, the berms provide a barrier to the flow of rainwater. Another pair of parallel berms 104, 106 extend along most of the width of the cover. This arrangement leaves four corner portions 110, 112, 114 and 116 without a berm or barrier to the flow of rainwater. Thus, a technician working with the electronics equipment in the upper chamber 24 through an open set of doors will not be exposed to runoff rainwater during a rain storm. Instead, the water will be directed to one or more of the four corner portions before dropping to the ground.

Figure 4:
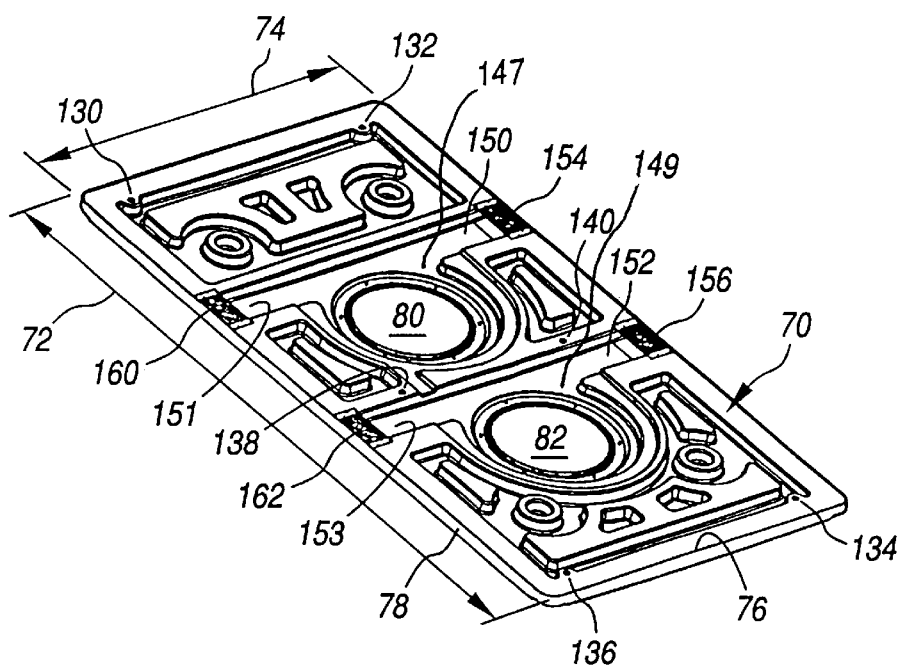
FIG. 4 is a bottom isometric view of the cover shown in FIG. 3.

Referring now to FIGS. 4, 5 and 7, the lower panel 70 is shown to have a very uneven surface so that in numerous sectional views, the lower panel has a corrugated profile. For example, portions of the lower panel have low horizontal surfaces such as the surface 120 and high horizontal surfaces such as the surface 122. In addition, the lower panel also has generally vertically disposed surfaces such as the surface 124. By repeating this pattern of corrugation, the strength of the lower panel is greatly enhanced. At the same time, the air chamber 79 is still maintained for purposes of thermal insulation.

Six fastener openings 130, 132, 134, 136, 138 and 140, FIG. 4, are provided near the periphery 78 so when assembled, the top cover may be attached to the remainder of the enclosure from within the enclosure. Thus, there are no attachment openings or fasteners exposed to the weather or for tampering.

Four additional fastener openings 142, 144, 146 and 148 are provided but these extend through both the upper and the lower panels. These openings align with the frame in the upper chamber so that eye bolts (not shown) may be passed through the top cover and attached to the frame to provide a strong connection to allow lifting of the entire enclosure for transport and installation. Once the enclosure is secured to a concrete foundation pad, the eye bolts may be removed and replaced with weatherproof plugs.

Two lateral passageways or ducts 150, 152, FIG. 4, are formed in the lower panel in the immediate vicinity of the two access ports 80, 82. Two scroll fan casings 147, 149 are also formed in the lower panel around the two access ports. Beneath the access ports are centrifugal fans, such as the fan 36. These fans are more powerful than those previously used and thus, provide more effective heat exchange. The fans are positioned so as to rotate about a vertical axis and exhaust air in a horizontal direction. When the cover is attached to the rest of the cabinet, the centrifugal fans push the exhaust air from the heat exchanger to the right when viewed in FIG. 4, through the passageways 150, 152 and out through stainless steel screens 154, 156 which are sonic welded to the bottom panel. Supplemental passageways or ducts 151, 153 are provided extending in the opposite direction, that is, to the left so that exhaust air may exit through the passageways 151, 153 and stainless steel screens 160 and 162 if, for example, the pressure at the screens 154 and 156 is too great for the fans to overcome. Such a situation may arise during a hurricane when strong winds, shown graphically in FIG. 2, blow against one side of the enclosure. If that side is the usual exit of the heat exchanger exhaust air, the pressure created by the wind may be greater than that generated by the fans. When this happens and if there is only one exhaust passageway, the fan will cease turning. To overcome this potential problem, an alternative path in the opposite direction is provided. With this technique, the heat exchanger fans are capable of operating even under severe weather conditions. Also, if the high winds are accompanied by heavy rain, water may be driven through the screens 154, 156 and into the passageways 150, 152. Providing the oppositely directed passageways 151, 153 allows the water to be driven through the cover instead of being forced into the cabinet through the fan. This flow by-pass arrangement means there will be no water build up or leakage.

A suitable centrifugal fan may be acquired from EBM/Papst of Farmington, Conn. The fan diameter is about 225 mm (or just under 9 inches) with a capacity of about 300 cfm at a pressure of one inch of water.

The upper and lower panels are made from the PVC blend mentioned above and are thermoformed. Molded stiffening members may be included during the forming operation to strengthen the cover. Wall thickness after forming is about 0.100 inches whereas the thickness of the panels before forming are about 0.125 inches. The length and width of the cover may vary depending upon the size of the cabinet; currently, the length may vary between 42 and 90 inches, and the width may be about 46.5 inches. The height of the cover (without lids) may be about 2.6 inches. The diameter of the access ports is about 14 inches. The exhaust air/water ducts may be about 5.5 inches wide.

It can now be readily appreciated that the inventive top cover provides efficient and effective thermal insulation as well as noise suppression. This is because of such features as the air space between the upper and lower panels and the use of synthetic resin which is inherently more dense than metal so as to resonate at a much higher frequency than metal. In addition, the inventive top cover has an air/water exhaust and a flow by-pass duct system that allows the heat exchanger fans to operate even under severe high pressure and wet circumstances. Further, the top cover has good strength characteristics and once capital expenditures are made, is easy to fabricate and handle because of the relatively low weight. With regard to manufacturing and assembly, a major advantage is that there will be no need to go through a complicated welding, machining and painting operation. Furthermore, since the panels are molded, it is easy to include the rain barrier berms for directing the rain out of the way of the access doors in the front and rear walls.

The specification describes in detail an embodiment of the present invention. Other modifications and variations will, under the doctrine of equivalents, come within the scope of the appended claims. For example, different dimensions and geometries or different materials are considered equivalent structures. Still other alternatives will also be equivalent as will many new technologies. There is no desire or intention here to limit in any way the doctrine of equivalents.

What is claimed is:

1. An equipment enclosure comprising:

front, rear and side portions and an interior chamber;

a heat exchanger mounted within said interior chamber;

a centrifugal fan operatively mounted to said heat exchanger for drawing and exhausting ambient air, said centrifugal fan being separated from said interior chamber;

a top cover forming a fan casing for said centrifugal fan, said top cover being mounted over said interior chamber;

said top cover including an enclosed air space; and said top cover including oppositely disposed passageways extending from said fan casing to a periphery of said top cover, said passageways being offset from said centrifugal fan such that an axis of rotation of said fan does not intersect said passageways.

2. An apparatus as claimed in claim 1 wherein:

said top cover is thermoformed of synthetic resin material.

* * * * *